(12) United States Patent
Hung et al.

(10) Patent No.: US 8,765,561 B2
(45) Date of Patent: Jul. 1, 2014

(54) METHOD FOR FABRICATING SEMICONDUCTOR DEVICE

(75) Inventors: Wen-Han Hung, Kaohsiung (TW); Tsai-Fu Chen, Hsinchu (TW); Ta-Kang Lo, Taoyuan County (TW); Tzyy-Ming Cheng, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 176 days.

(21) Appl. No.: 13/154,396

(22) Filed: Jun. 6, 2011

(65) Prior Publication Data

US 2012/0309158 A1    Dec. 6, 2012

(51) Int. Cl.
*H01L 21/336* (2006.01)

(52) U.S. Cl.
USPC .............. 438/308; 438/795; 257/E21.623; 257/E21.453

(58) Field of Classification Search
CPC .............. H01L 21/28185; H01L 29/7847
USPC ............. 438/308, 795, 799; 257/E21.623, 257/E21.444, E21.453, E21.434
See application file for complete search history.

(56) References Cited

U.S. PATENT DOCUMENTS

| | | | |
|---|---|---|---|
| 5,447,884 A | 9/1995 | Fahey | |
| 6,043,138 A | 3/2000 | Ibok | |
| 6,245,626 B1 | 6/2001 | Chen | |
| 6,372,605 B1 | 4/2002 | Kuehne | |
| 6,509,232 B1 | 1/2003 | Kim | |
| 6,652,718 B1 | 11/2003 | D'Couto | |
| 6,670,275 B2 | 12/2003 | Lee | |
| 7,030,430 B2 | 4/2006 | Doczy et al. | |
| 7,084,025 B2 | 8/2006 | Phua | |
| 7,118,987 B2 | 10/2006 | Fu | |
| 7,119,404 B2 | 10/2006 | Chang | |
| 7,138,323 B2 | 11/2006 | Kavalieros | |
| 7,153,755 B2 | 12/2006 | Liu | |
| 7,208,366 B2 | 4/2007 | Tsai | |
| 7,271,464 B2 | 9/2007 | Trivedi | |
| 7,314,793 B2 | 1/2008 | Frohberg | |
| 7,384,880 B2 | 6/2008 | Brask | |
| 7,396,728 B2 | 7/2008 | Varghese | |
| 7,456,067 B2 | 11/2008 | Ang | |
| 7,482,245 B1 | 1/2009 | Yu | |
| 7,517,816 B2 | 4/2009 | Frohberg | |
| 7,521,324 B2 | 4/2009 | Ohmi | |
| 7,592,270 B2 | 9/2009 | Teo | |
| 7,601,648 B2 | 10/2009 | Chua et al. | |
| 7,824,990 B2 | 11/2010 | Chang | |
| 8,211,775 B1 * | 7/2012 | Ma et al. | 438/287 |
| 2002/0135071 A1 | 9/2002 | Kang | |
| 2004/0147082 A1 * | 7/2004 | Kim | 438/301 |
| 2005/0202624 A1 | 9/2005 | Li | |
| 2006/0001095 A1 | 1/2006 | Doris | |
| 2006/0046523 A1 * | 3/2006 | Kavalieros et al. | 438/791 |
| 2006/0197161 A1 | 9/2006 | Takao | |
| 2006/0281245 A1 | 12/2006 | Okuno | |

(Continued)

*Primary Examiner* — Caridad Everhart
(74) *Attorney, Agent, or Firm* — Winston Hsu; Scott Margo

(57) ABSTRACT

A method for fabricating semiconductor device is disclosed. The method includes the steps of: providing a substrate; forming a dummy gate on the substrate; forming a contact etch stop layer on the dummy gate and the substrate; performing a planarizing process to partially remove the contact etch stop layer; partially removing the dummy gate; and performing a thermal treatment on the contact etch stop layer.

16 Claims, 4 Drawing Sheets

(56) References Cited

U.S. PATENT DOCUMENTS

| | | |
|---|---|---|
| 2007/0032095 A1* | 2/2007 | Ramaswamy et al. ......... 438/795 |
| 2007/0077765 A1* | 4/2007 | Prince et al. ................... 438/694 |
| 2007/0090466 A1* | 4/2007 | Park et al. ...................... 257/382 |
| 2007/0141852 A1 | 6/2007 | Stapelmann |
| 2008/0173947 A1 | 7/2008 | Hou |
| 2008/0242020 A1 | 10/2008 | Chen |
| 2009/0159981 A1 | 6/2009 | Niimi |
| 2009/0200494 A1 | 8/2009 | Hatem |
| 2009/0224293 A1* | 9/2009 | Miyanami ..................... 257/288 |
| 2009/0230439 A1 | 9/2009 | Wang |
| 2009/0289284 A1 | 11/2009 | Goh et al. |
| 2010/0075507 A1 | 3/2010 | Chang |
| 2010/0102394 A1* | 4/2010 | Yamakawa et al. ........... 257/369 |
| 2010/0155954 A1* | 6/2010 | Mukherjee et al. ........... 257/754 |
| 2010/0184281 A1 | 7/2010 | Hsu |
| 2010/0184359 A1 | 7/2010 | Park |
| 2010/0261323 A1* | 10/2010 | Chen et al. .................... 438/199 |
| 2011/0076823 A1* | 3/2011 | Lin et al. ....................... 438/299 |
| 2011/0086502 A1* | 4/2011 | Yeh et al. ...................... 438/585 |
| 2011/0156154 A1* | 6/2011 | Hoentschel et al. .......... 257/369 |
| 2012/0139053 A1* | 6/2012 | Ando et al. ................... 257/369 |
| 2012/0146155 A1* | 6/2012 | Hoentschel et al. .......... 257/369 |
| 2012/0196452 A1* | 8/2012 | Balseanu et al. .............. 438/791 |
| 2012/0217590 A1* | 8/2012 | Babich et al. ................. 257/410 |
| 2012/0252198 A1* | 10/2012 | Zhu et al. ...................... 438/585 |
| 2012/0264284 A1* | 10/2012 | Wang et al. ................... 438/592 |
| 2012/0286375 A1* | 11/2012 | Cai et al. ....................... 257/412 |
| 2013/0017679 A1* | 1/2013 | Lenski et al. ................. 438/591 |

* cited by examiner

METHOD FOR FABRICATING SEMICONDUCTOR DEVICE

BACKGROUND OF THE INVENTION

1. Field of the Invention

The invention relates to a method for fabricating semiconductor device, and more partially, to a method for fabricating semiconductor device having metal gate.

2. Description of the Prior Art

With a trend towards scaling down size of the semiconductor device, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus work function metals are developed to replace the conventional polysilicon gate to be the control electrode that competent to the high-K gate dielectric layer.

However, there is always a continuing need in the semiconductor processing art to develop semiconductor device renders superior performance and reliability even though the conventional silicon dioxide or silicon oxynitride gate dielectric layer is replaced by the high-K gate dielectric layer and the conventional polysilicon gate is replaced by the metal gate.

SUMMARY OF THE INVENTION

It is an objective of the present invention to provide a method for fabricating semiconductor device with metal gate for improving the bottleneck caused by conventional process.

According to a preferred embodiment of the present invention, a method for fabricating semiconductor device is disclosed. The method includes the steps of: providing a substrate; forming a dummy gate on the substrate; forming a contact etch stop layer on the dummy gate and the substrate; performing a planarizing process to partially remove the contact etch stop layer; partially removing the dummy gate; and performing a thermal treatment on the contact etch stop layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
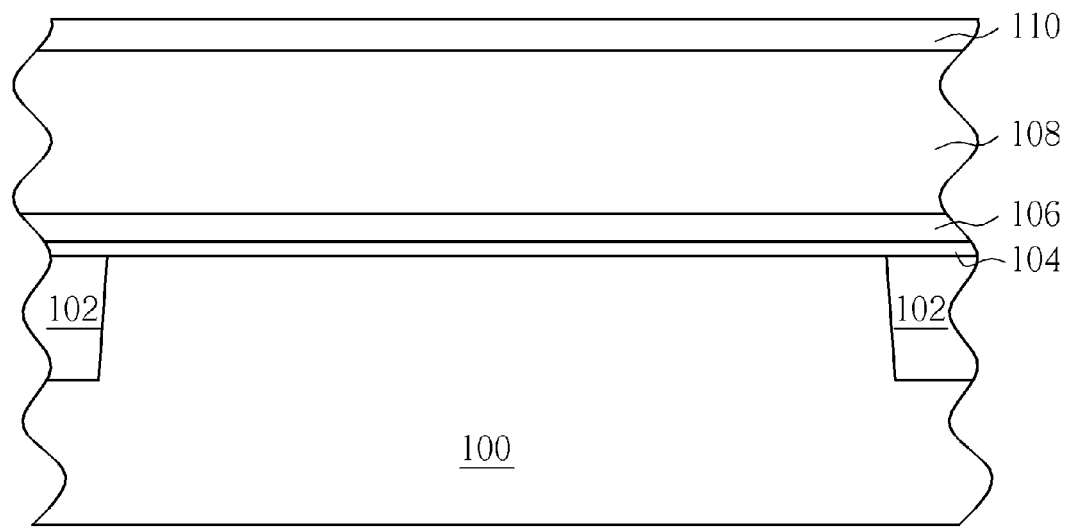
FIGS. 1-7 illustrate a method for fabricating a semiconductor device having metal gate according to a preferred embodiment of the present invention.

Referring to FIGS. 1-5, FIGS. 1-5 illustrate a method for fabricating a semiconductor device having metal gate. In this embodiment, the semiconductor device is preferably an NMOS transistor, in which the method preferably utilizes a gate-first approach accompanying a high-k first fabrication. As shown in FIG. 1, a substrate 100, such as a silicon substrate or a silicon-in-insulator (SOI) substrate is provided. A plurality of shallow trench isolations (STI) 102 used for electrical isolation is also formed in the substrate 100.

Next, an interfacial layer 104 composed of oxide or nitride is formed on the surface of the substrate 100. Next, a film stack composed of a high-k dielectric layer 106, a polysilicon layer 108, and a hard mask 110 is formed on the interfacial layer 104. Preferably, a barrier layer (not shown) could be formed on the high-k dielectric layer 106 and the polysilicon layer 108 is used as a sacrificial layer, which could be composed of undoped polysilicon, polysilicon having n+ dopants, or amorphous polysilicon material.

The high-k dielectric layer 106 could be a single-layer or a multi-layer structure containing metal oxide layer such as rare earth metal oxide, in which the dielectric constant of the high-k dielectric layer 106 is substantially greater than 20. For example, the high-k dielectric layer 106 could be selected from a group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide, $Ta_2O_5$, zirconium oxide ($ZrO_2$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). The hard mask 110 could be composed of $SiO_2$, SiN, SiC, or SiON.

Figure 2:
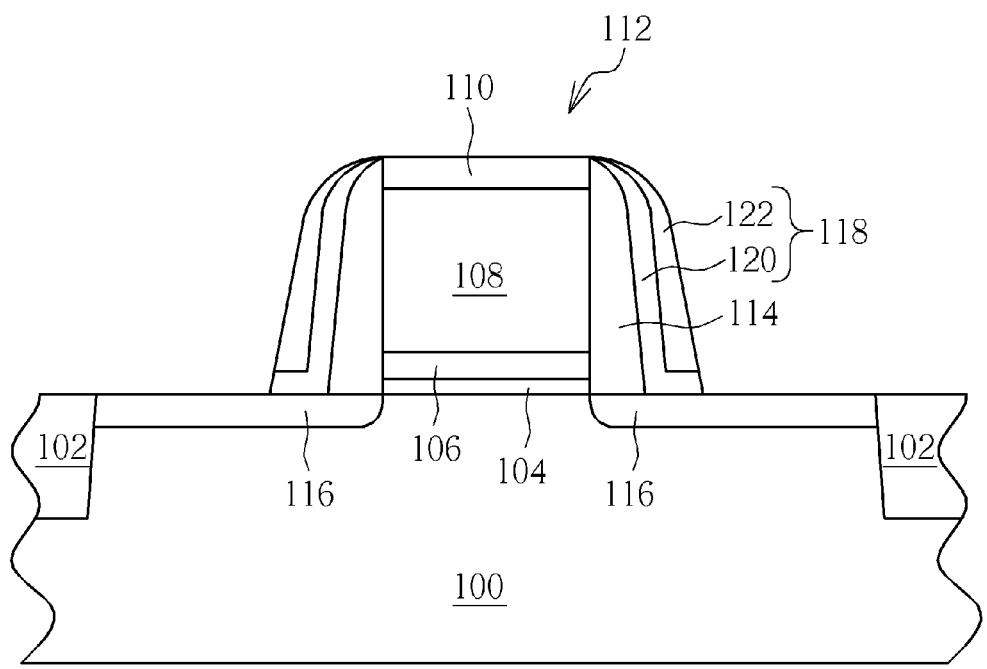

Next, as shown in FIG. 2, a patterned photoresist (not shown) is formed on the hard mask 110, and a pattern transfer is performed by using the patterned photoresist as mask to partially remove the hard mask 110, the polysilicon layer 108, the high-k dielectric layer 106, and the interfacial layer 104 through single or multiple etching processes. After stripping the patterned photoresist, a dummy gate 112 is formed on the substrate 100.

Next, a first spacer 114 composed of silicon nitride is formed on the sidewall surface of the gate structure 112 and the surface of the substrate 100, and a lightly doped ion implantation is carried out along with a thermal process to implant n-type dopants into the substrate 100 adjacent to two sides of the gate structure 112 for forming a lightly doped drain 116. As a thermal process is conducted after the ion implantation, the lightly doped drain 116 is preferably diffused into the substrate 100 directly under the first spacer 114. Next, a second spacer 118 is formed around the first spacer 114, in which the second spacer 118 can be a composite structure consisting of an L-shaped oxide layer 120 and a nitride layer 122 sitting thereon.

Figure 3:
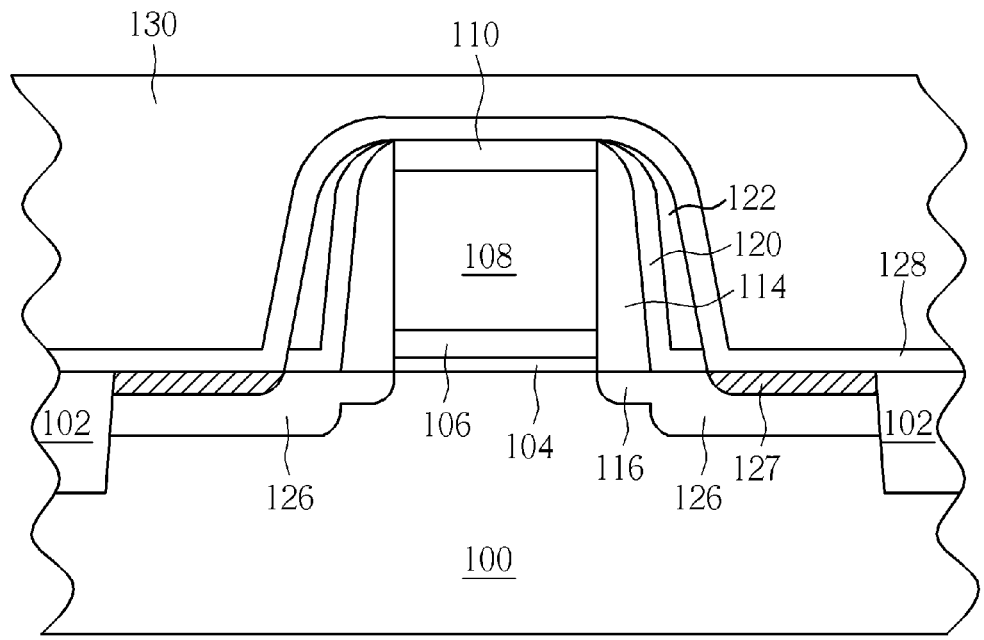

Next, as shown in FIG. 3, an ion implantation process is performed along with a thermal process to implant n-type dopants into the substrate 100 adjacent to two sides of the aforementioned second spacer 118 for forming a source/drain region 126. Similar to the formation of the lightly doped drain 116, as a thermal process is conducted after the ion implantation, the source/drain region 126 is preferably diffused into the substrate 100 directly under the second spacer 118. In this embodiment, a selective strain scheme (SSS) can be used for forming the source/drain region 126. For example, a selective epitaxial growth (SEG) can be used to form epitaxial silicon layers with silicon carbide (SiC) for forming the source/drain region 126. Additionally, silicides 127 are formed on the surface of the source/drain region 126. Thereafter, a contact etch stop layer (CESL) 128 and an inter-layer dielectric (ILD)

130 layer are sequentially formed on the substrate 100. In this embodiment, the contact etch stop layer 128 preferably has a thickness between 50 Angstroms to 200 Angstroms, and the contact etch stop layer 128 is preferably a tensile contact etch stop layer.

Figure 4:
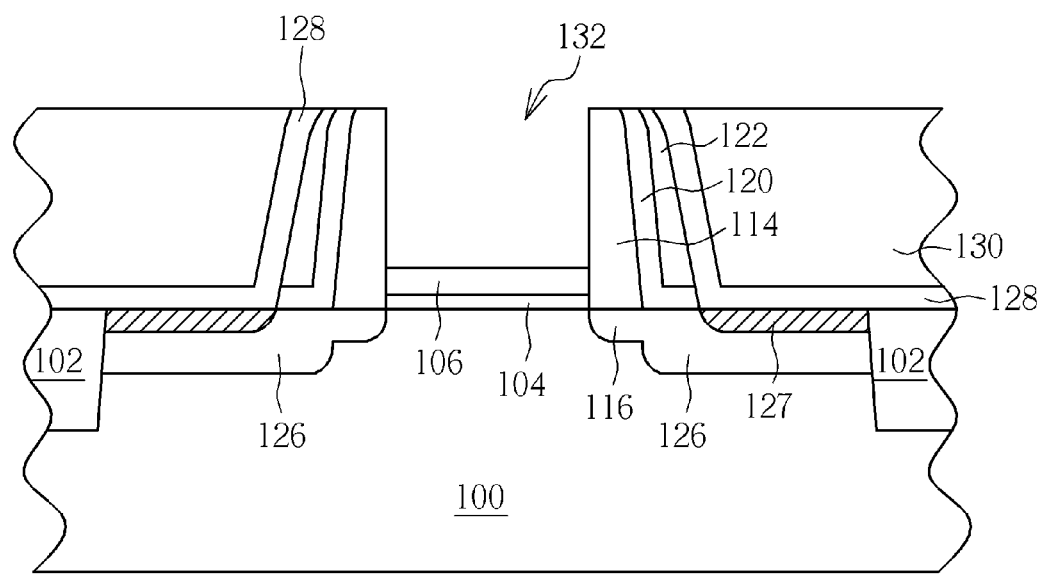

As shown in FIG. 4, a planarizing process, such as a chemical mechanical polishing (CMP) is conducted to partially remove the ILD layer 130, the contact etch stop layer 128, and the patterned hard mask 110 until exposing the polysilicon layer 108. Another adequate etching process could then be carried out to remove the polysilicon layer 108 for forming a trench 132. During this step, the high-k dielectric layer 106 could be used as an etching stop layer to protect the interfacial layer 104 underneath from the etching process conducted previously.

Next, a thermal treatment is performed on the contact etch stop layer 128 by using a temperature between 300° C. to 1000° C. to increase the tensile strain of the contact etch stop layer 128 to the channel region of the NMOS transistor. In this embodiment, the thermal treatment preferably includes a spike anneal process, a millisecond anneal process, a UV curing process, or combination thereof. Preferably, the temperature of the spike anneal process is between 500° C. to 700° C. and the duration of the process is between 1 second to 2 seconds; the temperature of the millisecond anneal process is between 700° C. to 950° C., and the duration of the process is between 0.2 ms to 40 ms; the temperature of the UV curing process is between 300° C. to 450° C., and the duration of the process is between 1 minute to 10 minutes.

Figure 5:
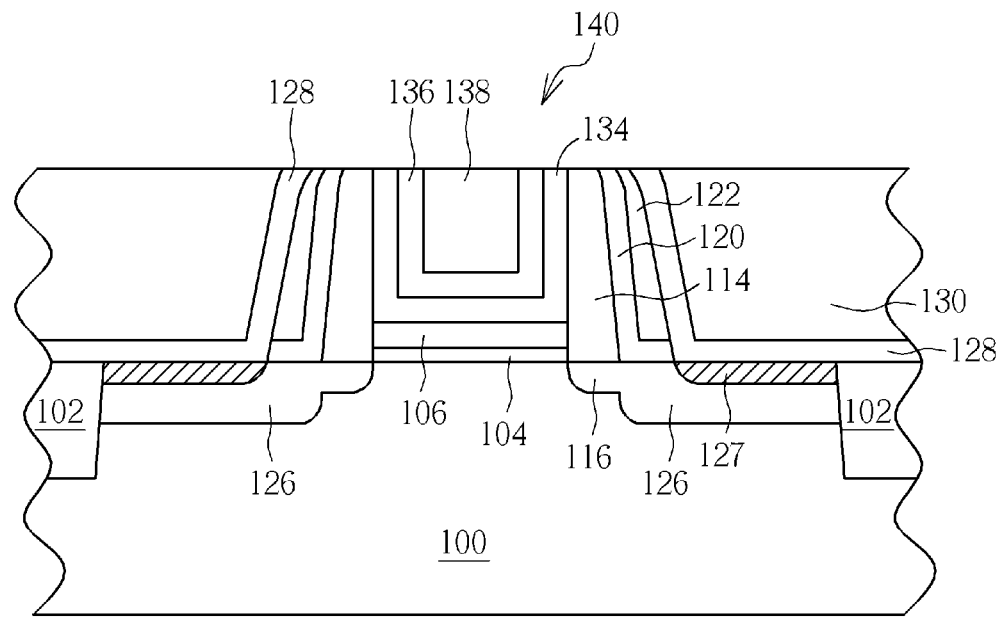

Next, as shown in FIG. 5, an n-type work function metal layer 134, a barrier layer 136, and a low resistance metal layer 138 are formed sequentially to fill the trench 132. A planarizing process is conducted thereafter to partially remove the low resistance metal layer 138, the barrier layer 136, and the work function metal layer 134 for forming a metal gate 140 on the substrate 100.

Next, a contact plug fabrication could be carried out to first using a patterned resist (not shown) as etching mask to partially remove the interlayer dielectric layer 130 and the contact etch stop layer 128 for forming a plurality of vias (not shown) connecting the source/drain region 126. Metal such as tungsten is deposited into the vias for forming contact plugs thereafter.

Figure 6:
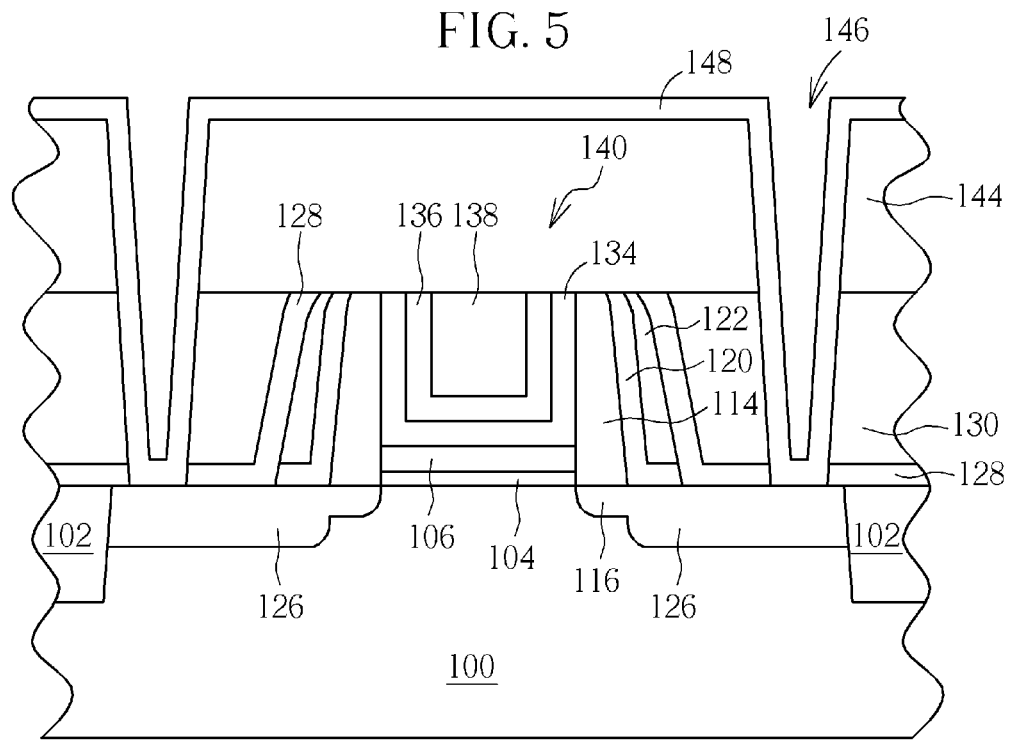
Figure 7:
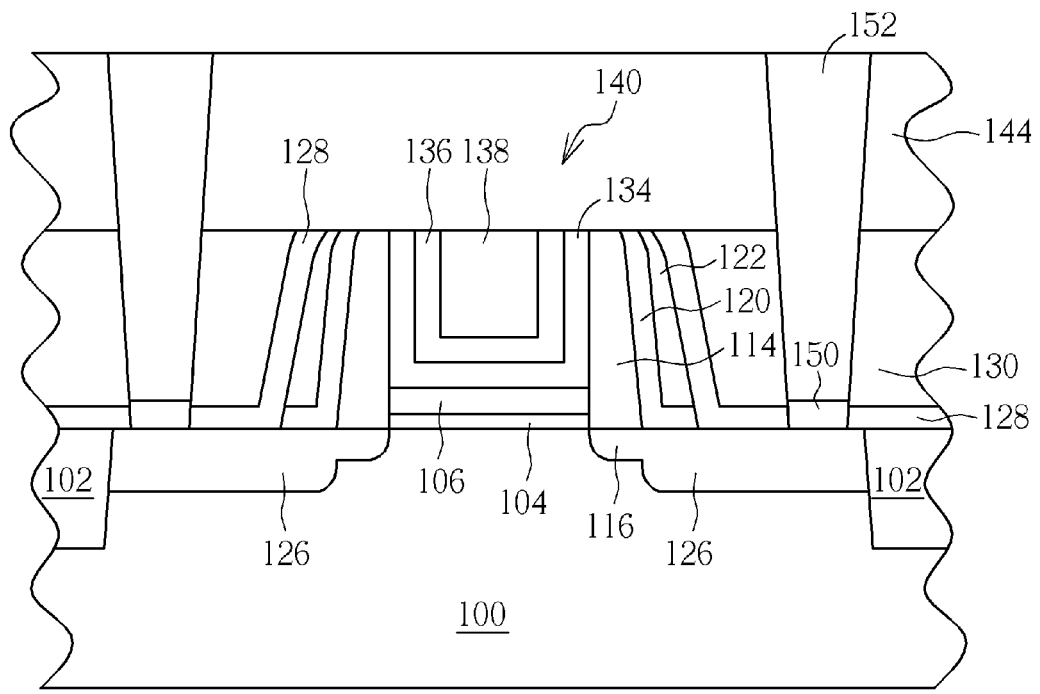
Figure 8:
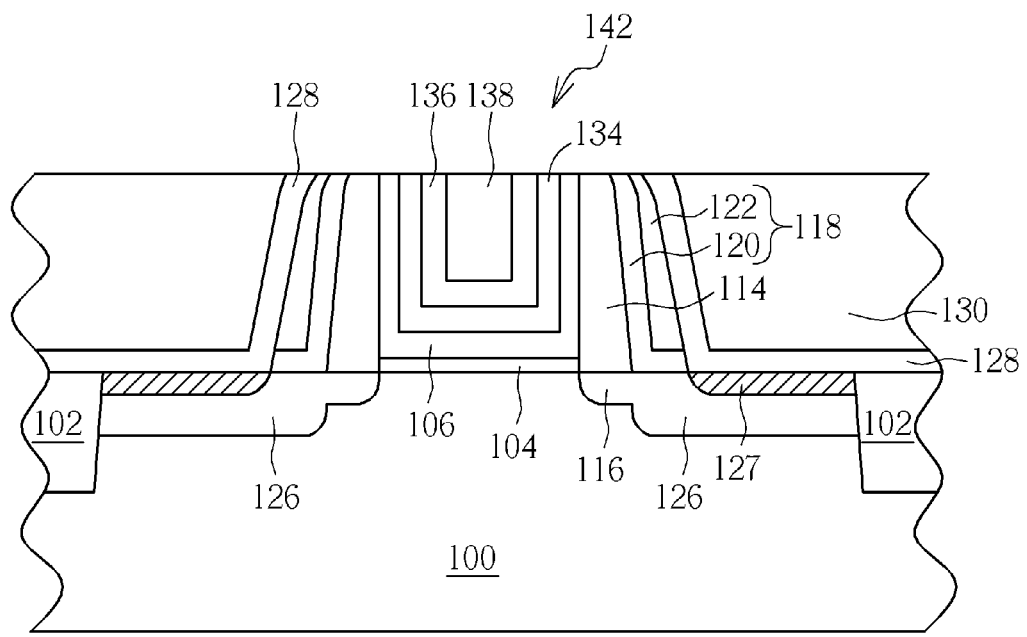
FIG. 8 illustrates a method for fabricating a semiconductor device having metal gate according to another embodiment of the present invention.

Despite the aforementioned embodiment forms a silicide layer on the source/drain region before the deposition of contact etch stop layer, the present invention could also cover the source/drain region with a contact etch stop layer directly without forming any silicide thereon, and then conduct a salicide process after the contact vias and the metal gate 140 are formed. For instance, as shown in FIGS. 6-7, after depositing an interlayer dielectric layer 144 on the metal gate 140, forming a plurality of contact vias 146 in the interlayer dielectric layer 144, metals 148 selected from a group consisting of cobalt, titanium, nickel, platinum, palladium, and molybdenum could be formed in the contact vias 146, and at least one rapid thermal anneal process could be conducted to react the metal layer 148 and the epitaxial layer for forming a silicide layer 150. After removing un-reacted metals, a metal material such as tungsten is deposited in the contact vias 146 to form contact plugs 152.

It should be noted that despite the aforementioned embodiment applies to a high-k first process, the present invention could also be applied to a high-k last process. For instance, a dummy gate of FIG. 2 could be first formed on a substrate, in which the dummy gate only includes an interfacial layer, a polysilicon layer, and a hard mask. Next, following the process carried out from FIGS. 3-4, a first spacer 114 and a second spacer 118 are formed around the dummy gate, a lightly doped drain 116 and a source/drain region 126 are formed in the substrate 100 adjacent to two sides of the first spacer 114 and second spacer 118, a contact etch stop layer 128 is formed on the dummy gate and the substrate 100, a planarizing process is performed to partially remove the contact etch stop layer 128, the dummy gate is removed, and a thermal treatment is performed on the contact etch stop layer 128. Next, a high-k dielectric fabrication could be performed, as shown in FIG. 6, to sequentially form a U-shaped high-k dielectric layer 106, an n-type work function metal layer 134, a barrier layer 136, and a low resistance metal layer 138 into the recess. After planarizing the layers deposited, a metal gate 142 is formed on the substrate 100, which is also within the scope of the present invention.

Overall, the present invention preferably removes the dummy gate disposed on a substrate, and then conducts a thermal treatment, such as a spike anneal, a millisecond anneal, or a UV curing process on the remaining contact etch stop layer for increasing the tensile stress applied to the channel region of the NMOS transistor. As conventional art typically performs a thermal treatment on the contact etch stop layer before the dummy gate is removed, the contact etch stop layer would often be in a relaxed state while part of the contact etch stop layer is planarized and the stress applied to the channel region is significantly degraded. Hence, by altering the timing for performing such thermal treatment, the present invention could increase the stress applied to the chancel region of the transistor and improve the performance of the device substantially.

Those skilled in the art will readily observe that numerous modifications and alterations of the device and method may be made while retaining the teachings of the invention.

What is claimed is:

1. A method for fabricating semiconductor device, comprising:
   providing a substrate;
   forming a dummy gate on the substrate;
   forming a contact etch stop layer on the dummy gate and the substrate, wherein the contact etch stop layer comprises a tensile stress layer;
   forming an interlayer dielectric layer on the tensile stress layer;
   performing a planarizing process to partially remove the interlayer dielectric layer and the contact etch stop layer;
   partially removing the dummy gate; and
   after removing the dummy gate, performing a thermal treatment on both the contact etch stop layer and the interlayer dielectric layer.

2. The method of claim 1, wherein the planarizing process comprises a chemical mechanical polishing process.

3. The method of claim 1, wherein the thermal treatment comprises a spike anneal process.

4. The method of claim 1, wherein the thermal treatment comprises a millisecond anneal process.

5. The method of claim 1, wherein the thermal treatment comprises a UV curing process.

6. The method of claim 1, wherein the contact etch stop layer is a tensile stress contact etch stop layer.

7. The method of claim 1, wherein the semiconductor device comprises an NMOS transistor.

8. The method of claim 1, wherein the contact etch stop layer comprises a thickness between 50 Angstroms to 200 Angstroms.

9. The method of claim 1, wherein the dummy gate comprises an interfacial layer, a high-k dielectric layer, and a polysilicon layer.

10. The method of claim 9, further comprising:
forming a source/drain region in the substrate adjacent to two sides of the dummy gate before forming the contact etch stop layer;
forming a silicide layer on the source/drain region;
covering an interlayer dielectric layer on the contact etch stop layer;
removing the polysilicon layer of the dummy gate to form a recess in the interlayer dielectric layer;
performing the thermal treatment on the contact etch stop layer; and
depositing a work function layer, a barrier layer, and a conductive layer in the recess for forming a gate.

11. The method of claim 10, wherein after forming the gate further comprises:
forming a plurality of contact vias in the dielectric layer; and
forming a silicide layer in the contact vias.

12. The method of claim 1, further comprising forming a spacer on the sidewall of the dummy gate.

13. The method of claim 12, further comprising forming the contact etch stop layer on the dummy gate, the substrate, and the spacer.

14. The method of claim 1, further comprising:
forming a source/drain region in the substrate adjacent to two sides of the dummy gate before forming the contact etch stop layer;
forming a silicide layer on the source/drain region;
covering an interlayer dielectric layer on the contact etch stop layer;
partially removing the dummy gate to form a recess in the interlayer dielectric layer;
performing the thermal treatment on the contact etch stop layer; and
forming a gate in the recess, wherein the gate comprises a high-k dielectric layer, a work function layer, a barrier layer, and a conductive layer.

15. The method of claim 14, wherein the high-k dielectric layer comprises a U-shaped high-k dielectric layer.

16. The method of claim 14, wherein after forming the gate further comprises:
forming a plurality of contact vias in the dielectric layer; and
forming a silicide layer in the contact vias.

* * * * *